(12) United States Patent
Risaki et al.

(10) Patent No.: US 8,071,460 B2
(45) Date of Patent: Dec. 6, 2011

(54) METHOD FOR MANUFACTURING SEMICONDUCTOR DEVICE

(75) Inventors: Tomomitsu Risaki, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/315,636

(22) Filed: Dec. 4, 2008

(65) Prior Publication Data

US 2009/0156009 A1 Jun. 18, 2009

(30) Foreign Application Priority Data

Dec. 12, 2007 (JP) ................................. 2007-320972

(51) Int. Cl.
*H01L 21/76* (2006.01)
*H01L 21/302* (2006.01)
*H01L 21/461* (2006.01)

(52) U.S. Cl. ......... 438/425; 438/717; 438/735; 438/736

(58) Field of Classification Search .................. 438/717, 438/735–736, 942–952, 424–438
See application file for complete search history.

(56) References Cited

U.S. PATENT DOCUMENTS

| | | | | |
|---|---|---|---|---|
| 5,413,966 A | * | 5/1995 | Schoenborn | 438/421 |
| 6,140,206 A | * | 10/2000 | Li et al. | 438/424 |
| 6,919,259 B2 | * | 7/2005 | Chang et al. | 438/421 |
| 7,199,058 B2 | * | 4/2007 | Maruyama et al. | 438/706 |
| 7,514,277 B2 | * | 4/2009 | Saito et al. | 438/16 |
| 2002/0025636 A1 | * | 2/2002 | Ju | 438/294 |
| 2003/0003756 A1 | * | 1/2003 | Yu | 438/706 |
| 2004/0175950 A1 | * | 9/2004 | Puppo et al. | 438/691 |
| 2005/0042837 A1 | * | 2/2005 | Hong et al. | 438/424 |
| 2006/0024945 A1 | * | 2/2006 | Kim et al. | 438/618 |
| 2008/0032508 A1 | * | 2/2008 | Chang | 438/725 |

OTHER PUBLICATIONS

Patent Abstracts of Japan, publication No. 2001-185532, publication date Jul. 6, 2001.

* cited by examiner

*Primary Examiner* — Michael Lebentritt
*Assistant Examiner* — Karen Kusumakar
(74) *Attorney, Agent, or Firm* — Adams & Wilks

(57) ABSTRACT

In a method of manufacturing a semiconductor device, a first film is formed directly on a semiconductor substrate and a second film is formed on the first film. A region of the second film is then etched to form an opening that exposes the first film. The first film is then arbitrarily patterned by etching to expose a surface of the semiconductor substrate. Thereafter, the second film and the exposed surface of the semiconductor substrate are simultaneously etched using the patterned first film as a mask and in an etching ambient having a low etching rate for the first film and having a high etching rate for the second film and the semiconductor substrate until the second film is almost completely etched and a detection amount of a monitored element of the first film increases.

6 Claims, 3 Drawing Sheets

METHOD FOR MANUFACTURING SEMICONDUCTOR DEVICE

BACKGROUND OF THE INVENTION

1. Field of the Invention

The present invention relates to a method of manufacturing a semiconductor device having a trench.

2. Description of the Related Art

Semiconductor devices have been advancing while reducing in size with the progress of time. A general method for size reduction is a pattern reduction in a plane by making full use of a miniaturization technology. The method is, however, approaching its limit in recent years, and hence size reduction of semiconductor devices using a three-dimensional structure, in which a depth direction of a semiconductor substrate is effectively used, has been newly attempted. Under those circumstances, a trench etching technique becomes indispensable. However, in the existing trench etching technique, a variation in trench depth direction is not small, which is a major problem in semiconductor devices in which characteristics are largely changed due to a size change in a depth direction. A technique frequently used to improve the variation is a manufacturing method using a stopper film. Conceptual views of the invention are illustrated in FIG. 3.

An etching stopper film 4, a to-be-trench-etched film 5, and a resist 6 are deposited on a semiconductor substrate 1 in this order, and the resist 6 is patterned (FIG. 3A). Here, a substance having a high etching selectivity with respect to the to-be-trench-etched film 5 is used for the etching stopper film 4. Next, the resist 6 is used as a mask to etch the to-be-trench-etched film 5. Since the etching is stopped at the etching stopper film 4, the depths of trenches formed in the to-be-trench-etched film 5 become constant. (For example, see JP 2001-185532 A)

In the method of the above-mentioned conventional art, however, formation of the etching stopper film 4 made of a substance different from the to-be-trench-etched film 5 is required immediately below the to-be-trench-etched film 5, which makes manufacturing steps complicated and causes an increase in cost. In addition, the to-be-trench-etched film 5 is deposited on the etching stopper film 4, causing inconvenience such as a physical limitation or defective electrical connection with the semiconductor substrate 1. In particular, this method cannot be used to form a trench directly on the silicon substrate 1.

SUMMARY OF THE INVENTION

The present invention has an object of providing a method of manufacturing a semiconductor device having a trench whose depth variation is small. The following measures are employed to solve the above-mentioned problems in the related art.

(1) There is provided a method of manufacturing a semiconductor device capable of providing a stable trench depth, including: forming, on a semiconductor substrate, a first film having a high etching selectivity with respect to the semiconductor substrate; forming, on the first film, a second film having a high etching selectivity with respect to the first film; etching a region of a part of the second film and the first film to expose a surface of the semiconductor substrate in the region; and etching the exposed surface of the semiconductor substrate to form a trench.

(2) There is provided a method of manufacturing a semiconductor device capable of providing a stable trench depth, including: forming, on a semiconductor substrate, a first film having a high etching selectivity with respect to the semiconductor substrate; forming, on the first film, a second film having a high etching selectivity with respect to the first film; etching a region of a part of the second film; etching a part of the first film exposed in the etched region of the part of the second film; and etching the semiconductor substrate to form a trench.

(3) In a method of manufacturing a semiconductor device, the semiconductor substrate is a silicon substrate, the first film is a silicon oxide film, and the second film is one of a polycrystalline silicon film and a silicon nitride film.

(4) In a method of manufacturing a semiconductor device, the semiconductor substrate is a silicon substrate, the first film is a metal film, and the second film is a silicon oxide deposition film.

With use of the above-mentioned means, a depth variation generated when a trench is formed in the semiconductor substrate can be reduced.

DETAILED DESCRIPTION OF THE PREFERRED EMBODIMENTS

Figure 1A:
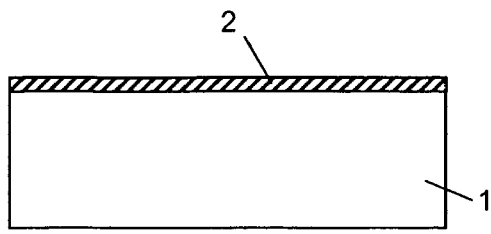
FIGS. 1A to 1F are views illustrating a first embodiment of the present invention.

FIGS. 1A to 1F illustrate a first embodiment of the present invention as a representative embodiment. First, as illustrated in FIG. 1A, a first film 2 is deposited on a semiconductor substrate 1 so as to be used as a mask for trench etching. In order to use the first film 2 as a mask for the trench etching of the semiconductor substrate 1, the first film 2 is selected to have a high etching selectivity. For example, when the semiconductor substrate 1 is a silicon substrate, a silicon oxide film is used for the first film 2.

Figure 1B:
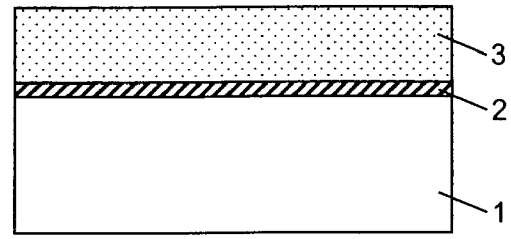

Next, as illustrated in FIG. 1B, a second film 3 for controlling a trench depth is deposited on the first film 2. Here, a material having a low etching selectivity with respect to the semiconductor substrate 1, which can be easily removed in the trench etching, is used for the second film 3. For example, when the semiconductor substrate 1 is a silicon substrate, polycrystalline silicon is used for the second film 3. In the trench etching, since the second film 3 has only to be etched simultaneously with the semiconductor substrate 1, not only the above-mentioned polycrystalline silicon but also a silicon nitride film can be used for the second film 3.

Figure 1C:
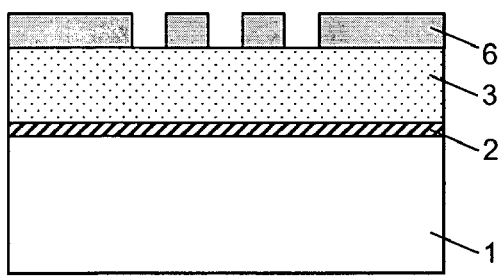
Figure 1D:
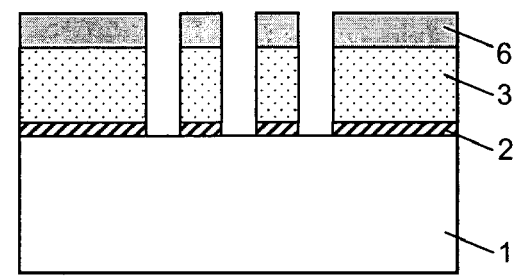

As illustrated in FIG. 1C, a resist 6 is applied on the second film 3 and patterned, and using the resist as a mask the second film 3 and the first film 2 are etched as illustrated in FIG. 1D. Since the first film 2 has a high etching selectivity with respect to the second film 3 in this case, the etching stops when the first film 2 is exposed. After detecting an end point in an etching machine, the first film 2 is then etched by using a gas capable of etching the first film 2. Since the semiconductor substrate 1 has a high etching selectivity with respect to the first film 2, the etching stops when the semiconductor substrate 1 is exposed.

Figure 1E:
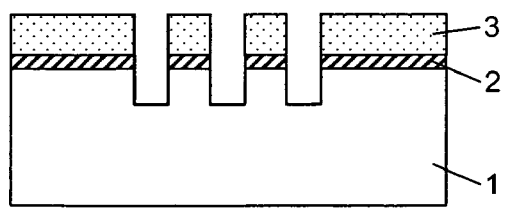

After removal of the resist 6, the semiconductor substrate is etched to form a trench structure. When the trench etching is performed, as illustrated in FIG. 1E, the second film 3 is also etched simultaneously with the semiconductor substrate 1.

Figure 1F:
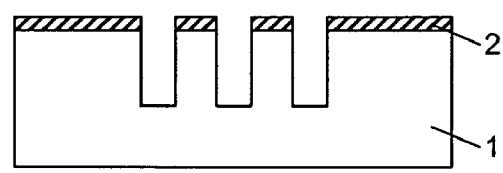

Finally, as illustrated in FIG. 1F, the second film 3 is completely etched, and the first film 2, which has been covered by the second film 3 so far, is exposed. By monitoring a specific wavelength within an etching chamber termination of the etching at the moment of detecting an element of the first film 2 enables termination of the etching at a trench etching depth according to a thickness of the second film 3. Even when an etching rate of the trench etching becomes unstable, the trench depth can be kept uniform as long as the thickness of the second film 3 is always constant. Further, the thickness of the second film 3 may be arbitrarily determined according to the selectivity between the second film 3 and the semiconductor substrate 1 in the trench etching and a target trench etching depth.

As described above, when the semiconductor substrate 1 is a silicon substrate, the first film 2 is silicon oxide film, and the second film 3 is polycrystalline silicon, respectively, the silicon substrate and the polycrystalline silicon have substantially the same etching selectivity with respect to the silicon oxide film. Thus, polycrystalline silicon of a thickness which substantially corresponds to a trench depth to be formed is required. For that reason, when a trench of a high aspect ratio is formed, etching of the silicon substrate through the trench of the polycrystalline silicon may exceed the capacity of the equipment and may fail from limitation of the equipment. In this case, a manufacturing method described in the following second embodiment of the present invention can be used, which enables the trench formation of the high aspect ratio with ease.

Figure 2A:
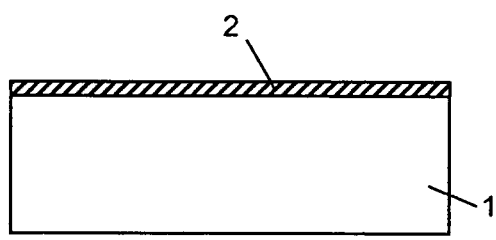
FIGS. 2A to 2F are views illustrating a second embodiment of the present invention.
Figure 2B:
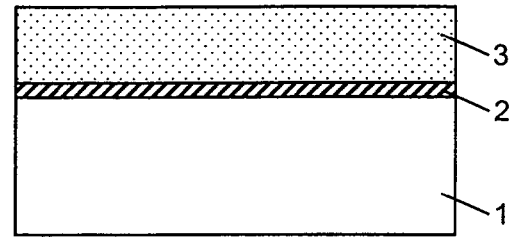
Figure 2C:
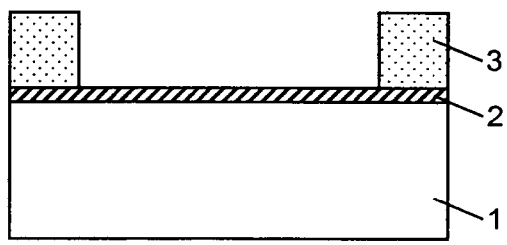
Figure 2D:
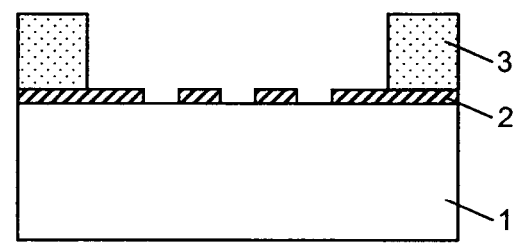
Figure 2E:
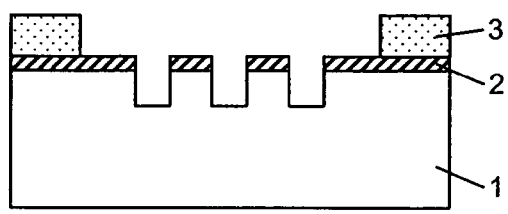
Figure 2F:
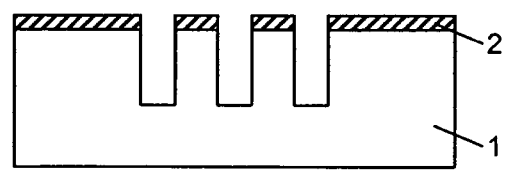
Figure 3A:
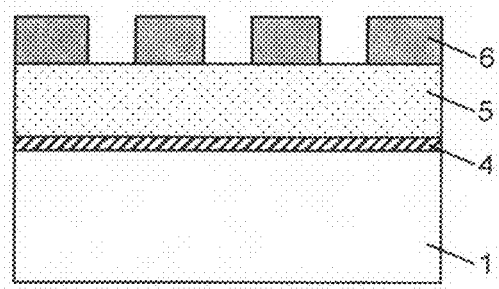
FIGS. 3A and 3B are views illustrating an embodiment of a conventional art.
Figure 3B:
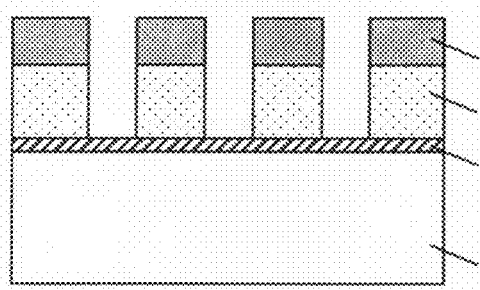

FIGS. 2A to 2F illustrate the second embodiment of the present invention. FIGS. 2A and 2B are completely the same as FIGS. 1A and 1B, but the second film 3 having a region in which a trench is formed as illustrated in FIG. 2C is partially removed by etching. After that, as illustrated in FIG. 2D, the first film 2 is arbitrarily patterned by etching so as to serve as a mask for trench etching. Lastly, the trench etching is performed by using the patterned first film 2 as a mask. At this time, an opening of the second film is larger compared with the method illustrated in FIGS. 1A to 1F, and hence it is easy to form a trench configuration having a higher aspect ratio in the semiconductor substrate 1. In this method as well, when this trench etching is performed, as illustrated in FIG. 2E, the second film 3 is also etched simultaneously in addition to the semiconductor substrate 1. Finally, as illustrated in FIG. 2F, the second film 3 is completely removed, and the first film 2, which has been covered by the second film 3 so far, is entirely exposed. Monitoring an element within an etching chamber, etching is terminated at the time illustrated in FIG. 2F at which a detection amount of the element of the first film is increased, whereby the etching can be terminated at a trench etching depth according to a thickness of the second film. Even when the etching rate of the trench etching becomes unstable, the trench depth can be kept uniform as long as the thickness of the second film 3 is always constant.

In the above-mentioned embodiments, the description has been made on the film structure in which the etching rate of the semiconductor substrate and the etching rate of the second film in the trench etching are set to be substantially equal to each other. However, when the rates are set to satisfy an inequality represented by the following Expression 1, a trench structure having a high aspect ratio can be formed.

etching rate (semiconductor substrate 1)≧etching rate (second film 3)≧etching rate (first film 2)    (Expression 1)

etching rate (semiconductor substrate 1)<etching rate (second film 3)<etching rate (first film 2)    (Expression 1)

For example, the inequality is satisfied in the case where the semiconductor substrate 1 is a silicon substrate, the first film 2 is a metal film, and the second film 3 is a silicon oxide deposition film. In so doing, the silicon oxide deposition film serving as the second film 3 is unlikely to be etched compared with the silicon substrate serving as the semiconductor substrate 1 in the state illustrated in FIG. 1E, and hence the thickness can be small compared with the case where the polycrystalline silicon is used for the second film 3, whereby the trench structure having the high aspect ratio can be easily formed in the semiconductor substrate 1.

Note that, when the silicon oxide deposition film serving as the second film 3 is patterned, a metal film which is a material having a higher selectivity than that of the silicon oxide deposition film has to be employed for the first film 2. For that reason, there is a concern that metal contamination within the trench occurs. However, regarding this contamination, a metal-contaminated portion can be removed by, after the first film 2 is removed after the state illustrated in FIG. 1F, cleaning the entire surface of the silicon with SC1 (liquid mixture of ammonia and hydrogen peroxide solution) or the like.

Hereinabove, the embodiments of the present invention have been described, but the present invention is not limited thereto. The present invention can be modified without departing from the gist thereof.

What is claimed is:

1. A method of manufacturing a semiconductor device, comprising:
   forming a first film directly on a semiconductor substrate;
   forming a second film on the first film;
   removing a region of the second film by a first etching step to form an opening that exposes the first film;
   patterning the exposed first film by a second etching step separate and independent from the first etching step to expose a surface of the semiconductor substrate through the first film directly over the exposed surface of the semiconductor substrate; and
   thereafter etching the second film and the exposed surface of the semiconductor substrate simultaneously using the patterned first film as a mask and in an etching ambient having a low etching rate for the first film and having a high etching rate for the second film and the semiconductor substrate until the second film is almost completely etched and a detection amount of a monitored element of the first film increases.

2. A method of manufacturing a semiconductor device according to claim 1; wherein the semiconductor substrate comprises a silicon substrate, the first film comprises a silicon oxide film, and the second film comprises one of a polycrystalline silicon film and a silicon nitride film.

3. A method of manufacturing a semiconductor device according to claim 1; wherein the semiconductor substrate comprises a silicon substrate, the first film comprises a metal film, and the second film comprises a silicon oxide deposition film.

4. A method of manufacturing a semiconductor device, comprising:
   forming a first film directly on a semiconductor substrate;
   forming a second film on the first film;
   removing a region of the second film by a first etching step to form an opening that exposes the first film;
   patterning the exposed first film by a second etching step separate and independent from the first etching step until a surface of the semiconductor substrate directly below the patterned first film is exposed, the patterned first film serving as a mask for trench etching; and thereafter performing trench etching using the patterned first film as a mask by etching the second film and the surface of the semiconductor substrate simultaneously in an etching ambient having a low etching rate for the first film and having a high etching rate for the second film and the semiconductor substrate until the second film is almost completely etched and a detection amount of a monitored element of the first film increases to thereby form a trench structure in the semiconductor substrate.

5. A method of manufacturing a semiconductor device according to claim 4; wherein the semiconductor substrate comprises a silicon substrate, the first film comprises a silicon oxide film, and the second film comprises one of a polycrystalline silicon film and a silicon nitride film.

6. A method of manufacturing a semiconductor device according to claim 4; wherein the semiconductor substrate comprises a silicon substrate, the first film comprises a metal film, and the second film comprises a silicon oxide deposition film.

* * * * *